United States Patent
O'Connor et al.

(12)

(10) Patent No.: US 6,456,676 B1
(45) Date of Patent: Sep. 24, 2002

(54) CLOCK SIGNAL DISTRIBUTION AND SYNCHRONIZATION

(75) Inventors: R. Brendan O'Connor, Portland, OR (US); Perry S. Stultz, Hillsboro, OR (US); George N. Bailey, III, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/385,216

(22) Filed: Aug. 27, 1999

(51) Int. Cl.[7] .............................. H04L 7/00; H03D 3/24
(52) U.S. Cl. ........................................ 375/354; 375/376
(58) Field of Search ................................ 375/354, 373, 375/376, 358, 327; 329/325, 147, 156; 331/25, 179; 327/156, 155, 158, 147, 141

(56) References Cited

U.S. PATENT DOCUMENTS

| | | | | |
|---|---|---|---|---|
| 5,886,582 A | * | 3/1999 | Stansell | 331/1 A |
| 6,191,632 B1 | * | 2/2001 | Iwata et al. | 327/295 |
| 6,208,702 B1 | * | 3/2001 | Ghoshal | 375/354 |
| 6,233,200 B1 | * | 5/2001 | Knoll et al. | 365/233 |
| 6,271,696 B1 | * | 8/2001 | Kobayashi | 327/144 |
| 6,292,016 B1 | * | 9/2001 | Jefferson et al. | 326/39 |

* cited by examiner

*Primary Examiner*—Chi Pham
*Assistant Examiner*—Khai Tran
(74) *Attorney, Agent, or Firm*—Blakely, Sokoloff, Taylor & Zafman LLP

(57) ABSTRACT

Methods and apparatuses for clock signal distribution and synchronization are described. A base clock signal (e.g., system clock signal) is provided to multiple components of an electronic system. Two or more of the components include clock generation circuitry to generate component clock signals based on the base clock signal. The component clock signals are distributed to one or more other components within the electronic system. The component clock generation circuitry is allowed to synchronize to the base clock signal during a first predetermined period of time (e.g., system boot up). At the end of the first predetermined period of time, the base clock signal is blocked from the component clock generation circuitry for a second predetermined period of time. At the expiration of the second predetermined period of time, the component clock generation circuitry is allowed to re-synchronize with the base clock signal. Because multiple synchronizations are started at the same time, the resulting component clock signals are synchronized to the base clock signal and are in phase with each other (i.e., have a common phase).

23 Claims, 4 Drawing Sheets

CLOCK SIGNAL DISTRIBUTION AND SYNCHRONIZATION

FIELD OF THE INVENTION

The invention relates to distribution of signals in an electronic device. More particularly, the invention relates to distribution and synchronization of clock signals.

BACKGROUND OF THE INVENTION

Typical clock distribution schemes consist of a clock generation circuit that provides a clock signal to one or more components. If a large number of components receive the clock signal, buffers can be used to boost the clock signal before the clock signal is distributed to the components in order to avoid fan out problems.

FIG. 1 is a block diagram of a prior art clock distribution scheme. System 100 includes clock generation circuit 110 that generates one or more clock signals. The clock signals are distributed to buffers 120, 124 and 128 for signal boosting and distribution to components 130, 132, 134, 136, 138, 140, 142, 144 and 146.

System 100 effectively distributes the clock signal(s) generated by clock generation circuit 110. However, each device of system 100 requires space on a printed circuit board and wires for interconnections between the devices. Therefore, the more devices that are included within system 100, the more complicated and expensive system 100 becomes.

What is needed is a clock signal distribution scheme that includes fewer devices in order to simplify an electronic system in which the clock signals are distributed.

SUMMARY OF THE INVENTION

Methods and apparatuses for clock signal distribution and synchronization are described. In one embodiment, a system includes a system clock generation circuit to generate a system clock signal. A plurality of clock generation circuits are coupled to receive the system clock signal. The clock generation circuits generate component clock signals based on the system clock signal. A buffer is coupled between the system clock generation circuit and the clock generation circuits. The buffer passes the clock signal to the clock generation circuits for a first predetermined period of time and, at the expiration of the first predetermined period of time, the buffer blocks the system clock from the clock generation circuits for a second predetermined period of time. The buffer passes the system clock signal to the clock generation circuits at the expiration of the second predetermined period of time. The clock generation circuits synchronize to the system clock during the first predetermined period of time and again after the expiration of the second predetermined period of time and the component clock signals have a common phase after the expiration of the second predetermined period of time.

DESCRIPTION OF THE DRAWINGS

The invention is illustrated by way of example, and not by way of limitation in the figures of the accompanying drawings in which like reference numerals refer to similar elements.

DETAILED DESCRIPTION

Methods and apparatuses for clock signal distribution and synchronization are described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Methods and apparatuses for clock signal distribution and synchronization are described. A base clock signal (e.g., a system clock signal) is provided to multiple components of an electronic system. Two or more of the components include clock generation circuitry to generate component clock signals based on the base clock signal. The component clock signals are distributed to one or more other components within the electronic system. The component clock generation circuitry is allowed to synchronize to the base clock signal during a first predetermined period of time (e.g., system boot up). At the end of the first predetermined period of time, the base clock signal is blocked from the component clock generation circuitry for a second predetermined period of time. At the expiration of the second predetermined period of time, the component clock generation circuitry is allowed to re-synchronize with the base clock signal. Because second synchronization sequence for the component clock generation circuitry is started at the same time for all components, the resulting component clock signals are synchronized to the base clock signal and are in phase with each other (i.e., have a common phase).

Figure 2:
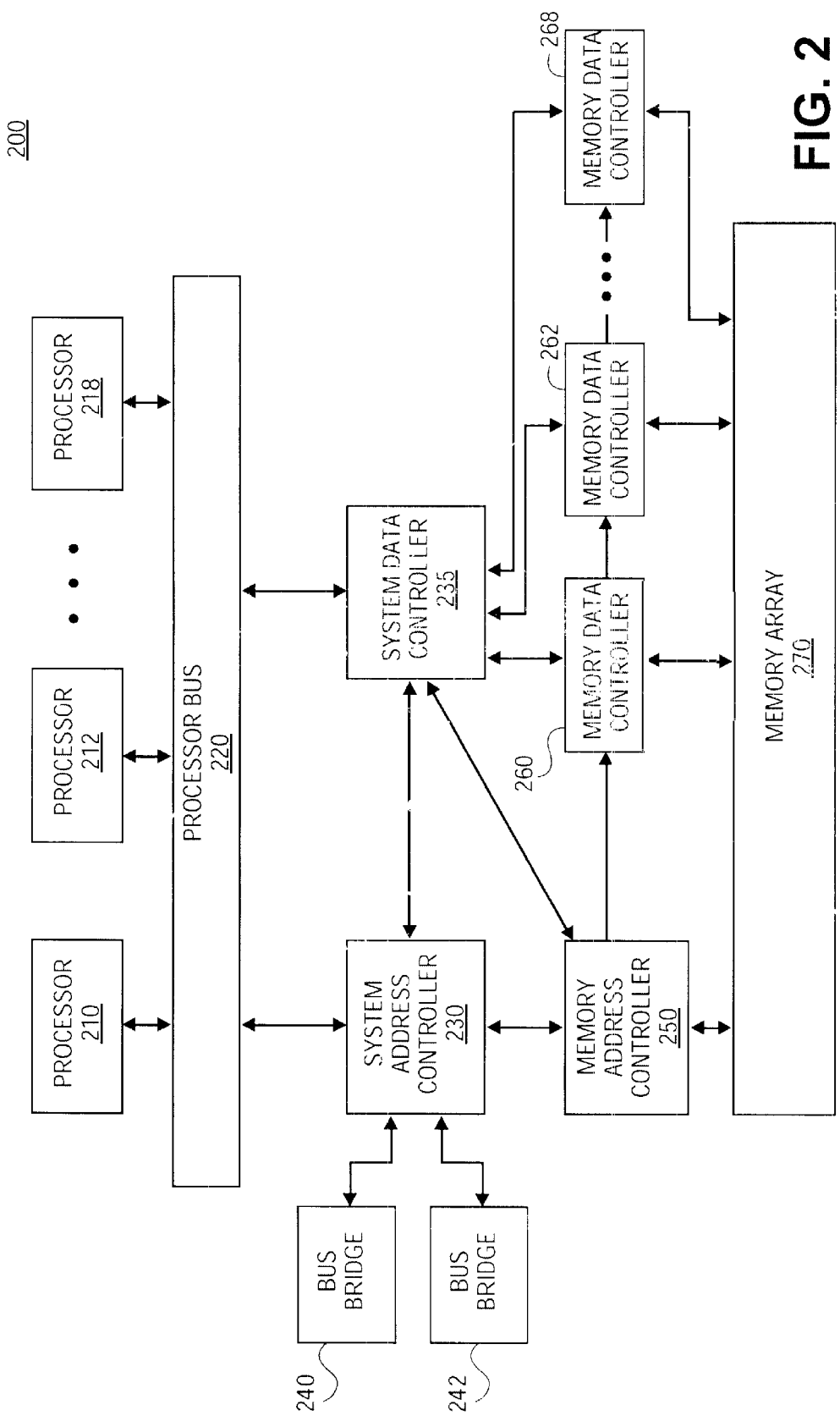
FIG. 2 is a block diagram of an electronic device having a clock distribution scheme.

FIG. 2 is a block diagram of an electronic device having a clock distribution scheme. Device 200 is illustrated with multiple processors; however, any number of processors can be used. Device 200 can be, for example, a computer system, or any other electronic device having multiple components that receive one or more synchronized clock signals.

In one embodiment, multiple processors (e.g., processors 210, 212, 218) are coupled to processor bus 220. In one embodiment, the processors are from the Pentium® family (e.g., Pentium®, Pentium® Pro, Pentium® II, Pentium® III) of processors available from Intel Corporation of Santa Clara, Calif.; however, other processors can also be used. System address controller 230 and system data controller 235 are also coupled to processor bus 220. System address controller 230 and system data controller 235 process addresses and data, respectively, on processor bus 220 and forward the addresses/data to the appropriate components within system 200.

Bus bridge 240 and bus bridge 242 are coupled to system address controller 230. Bus bridges 240 and 242 forward information to additional system buses (not shown in FIG. 2). The additional buses can be for example, a Peripheral Component Interconnect (PCI) bus, an Industry Standard Architecture (ISA) bus, an Extended Industry Standard Architecture (EISA), a universal serial bus (USB) or any other type of bus.

Memory address controller 250 operates as an interface between system address controller 230 and memory array 270. Memory address controller 250 provides addresses to memory array 270 for memory access operations. One or more memory data controllers (e.g., 260, 262, 268) provide an interface between system data controller 235 and memory array 270. Memory data controllers send data to, and receive data from, memory array 270.

In one embodiment, memory data controllers include clock generation circuitry to provide synchronized clock signals to memory array 270. The clock generation circuitry can be, for example, one or more phase locked loop (PLL) circuits. Delay locked loop (DLL) circuits can also be used to generate clock signals. In one embodiment, the memory data controllers also receive clock feedback signals from memory array 270.

Figure 1:
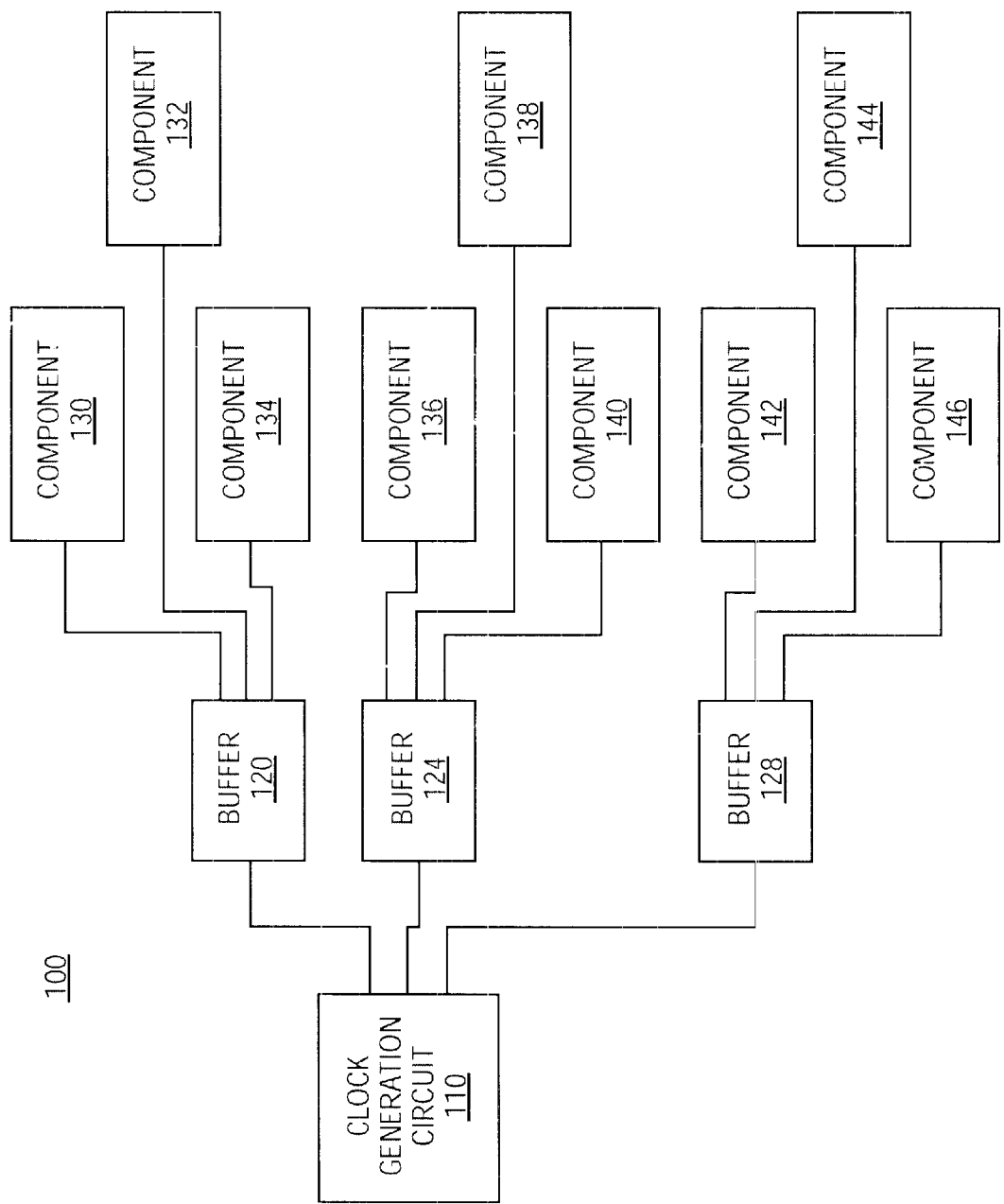
FIG. 1 is a block diagram of a prior art clock distribution scheme.

Each memory data controller generates one or more clock signals for a portion of memory array 270. Because components that provide memory functions for device 200 also generate clock signals for memory array 270, the number of components and the interconnection complexity can be reduced compared to the system of FIG. 1. However, because clock signals are generated by multiple devices and provided to a single device, in order to provide reliable memory access operations, the clock signals are synchronized. While a clock distribution and synchronization scheme is described with respect to memory data controllers and a memory array, the distribution and synchronization scheme described can be used with any distributed clock signal environment.

Figure 3:
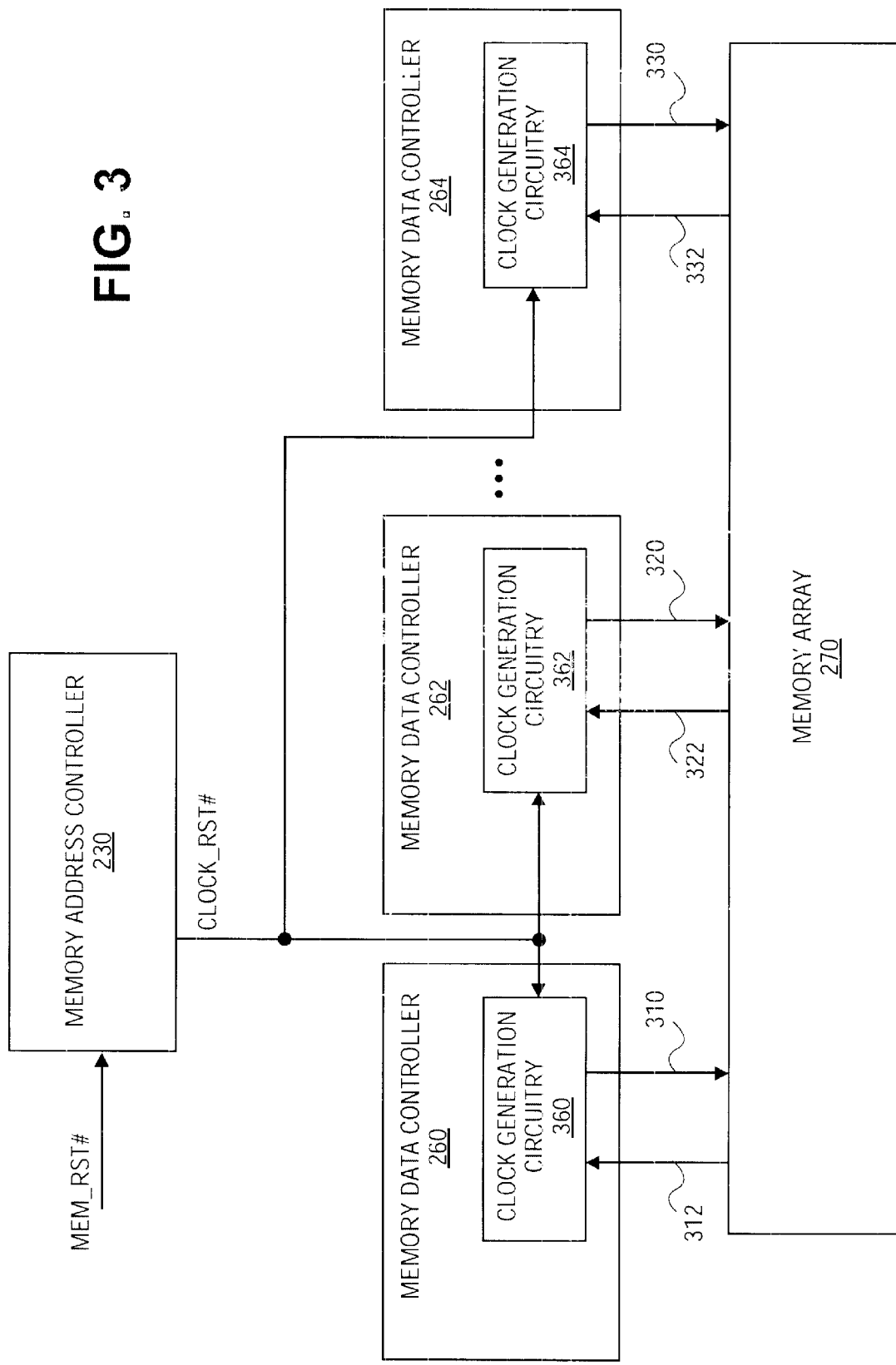
FIG. 3 is a block diagram of multiple memory data controllers to generate clock signals for a memory array.

FIG. 3 is a block diagram of multiple memory data controllers to generate clock signals for a memory array. Memory data controller 260 generates one or more clock signals, for example, with an internal PLL or other clock generation circuitry 360. The clock signal(s) is/are sent to memory array 270 via line(s) 310. Similarly, memory data controller 262 and memory data controller 264 include clock generation circuitry 362 and 364, respectively, generate clock signals, which are communicated to memory array 270 via lines 320 and 330, respectively.

In one embodiment, the clock signals generated by memory data controllers 260, 262 and 264 are provided to a portion of memory array 270. Clock signals that have been routed through a portion of memory array 270 are sent back to the memory data controllers as feedback signals. For example, memory data controller 260 receives a clock feedback signal from memory array 270 via line 312. Similarly, memory data controller receives a clock feedback signal from memory array 270 via line 322 and memory data controller 264 receives a clock feedback signal form memory array 270 via line 332.

In the description that follows, the clock generation circuitry is referred to as PLLs; however, as noted above, other types of clock generation circuitry can also be used. The clock feedback signals are used by the PLLs internal to the memory data controllers to synchronize the respective clock signals for the relevant portions of memory array 270. The PLLs align the edges of the outgoing clock signals with the edges of the feedback clock signals. This synchronizes the clock signals within the region of memory array 270 that are receiving clock signals from a particular PLL. However, the multiple PLLs may not be synchronized with each other.

In one embodiment, the CLOCK_RST# signal is generated by memory address controller 230 based on the MEM_RST# signal and is used to synchronize the multiple PLLs. In one embodiment, the multiple PLLs are allowed to generate clock signals and synchronize to the clock feedback signals for a first predetermined period of time that is sufficient to allow the PLLs to synchronize (e.g., during system boot, system reset). In one embodiment, the first predetermined period of time is 2 ms; however, other periods of time that are either longer or shorter can also be used. In one embodiment, the memory data controllers include buffers that block the system clock signal during the first predetermined period of time.

At the end of the first predetermined period of time the CLOCK_RST# signal is asserted for a second predetermined period of time. During the second predetermined period of time, the PLLs do not receive the system clock signal. In one embodiment, an AND gate receiving the CLOCK_RST# signal and the system clock signal is used to mask the system clock signal during the second predetermined period of time. In alternative embodiments, other devices (e.g., NAND gate, buffer) can be used to mask the system clock signal during the second predetermined period of time.

At the end of the second predetermined period of time the PLLs receive the system clock signal and begin synchronization at the same time. By synchronizing the beginning of the synchronization process for the multiple PLLs, each of the PLLs begins the synchronization process with the same system clock edge. This allows the PLLs to synchronize to the same system clock edge and thereby provide synchronized output clock signals.

Figure 4:
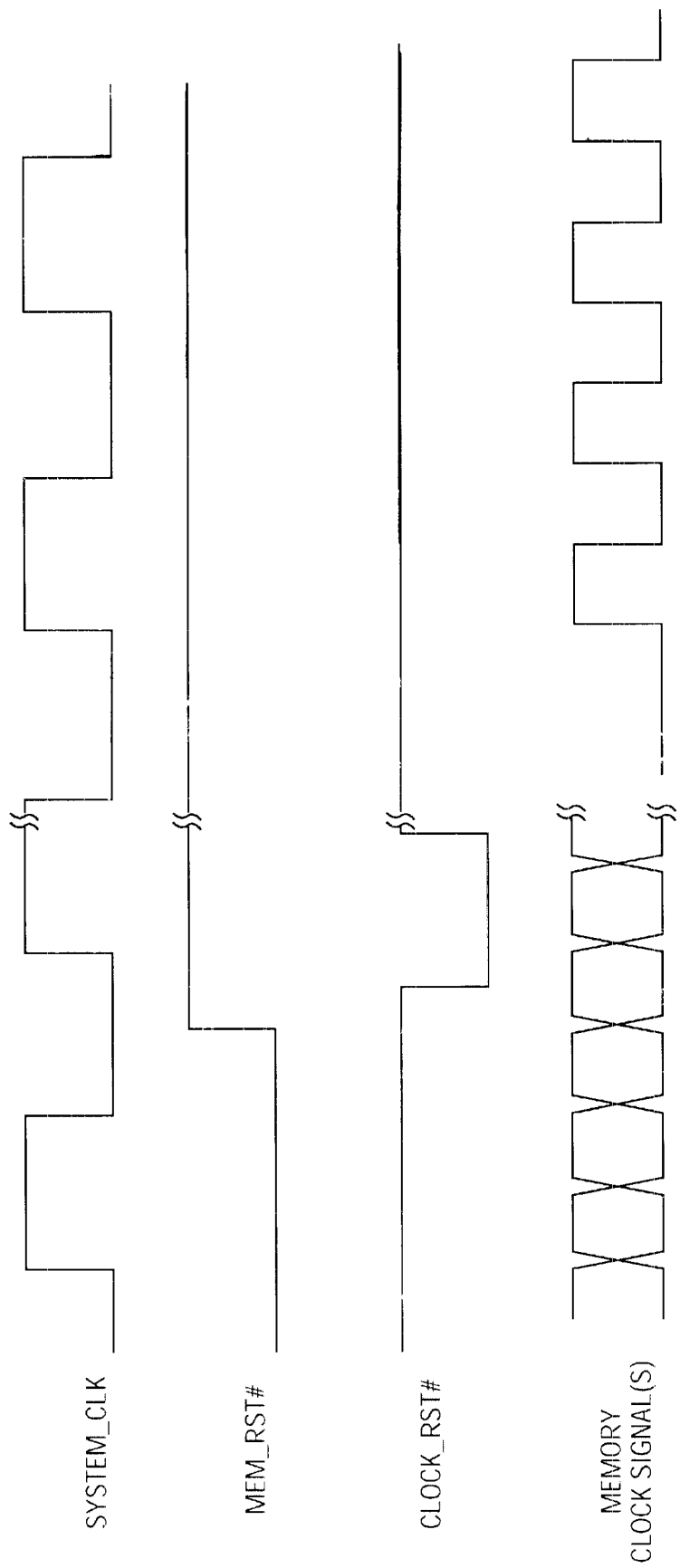
FIG. 4 is a timing diagram of signals to synchronize one embodiment of multiple PLLs generating clock signals.

FIG. 4 is a timing diagram of signals to synchronize one embodiment of multiple PLLs generating clock signals. The system clock (SYSTEM_CLK) signal that is provided to the components that generate the memory clock signals. For example, memory address controller 230 or system data controller 235 can provide the SYSTEM_CLK signal to the memory data controllers. The SYSTEM_CLK signal can also be provided by other components, for example, processor 210, or any other component.

The memory reset (MEM_RST#) signal initiates synchronization of the multiple PLLs. In one embodiment the memory reset signal is a low asserted signal (indicated by "#" in FIGS. 3 and 4); however, the memory reset signal is not required to be a low asserted signal. In one embodiment, the MEM_RST# signal is held low for a first predetermined period of time. During the first predetermined period of time the PLLs are allowed to synchronize based on the clock feedback signals.

It is possible that some of the PLLs will synchronize to the rising edges of the SYSTEM_CLK signal and some PLLs will synchronize to the falling edges of the SYSTEM_CLK signal. If the PLLs do not all synchronize to the same edge (e.g. rising, or falling) of the SYSTEM_CLK signal, a memory clock signal output by one PLL can be 180° out of phase with respect to another memory clock signal output by another PLL. Out of phase memory clock signals can result memory access errors.

In one embodiment, in response to the MEM_RST# signal, the clock reset (CLOCK_RST#) signal is asserted for a second predetermined period of time. In one embodiment the clock reset signal is a low asserted signal (indicated by "#" in FIGS. 3 and 4); however, the clock reset signal is not required to be a low asserted signal. The CLOCK_RST# signal masks the SYSTEM_CLK signal from the PLLs. In other words, during the second predetermined period of time, the PLLs do not receive the SYSTEM-CLK signal. When the CLOCK_RST# signal is deasserted, the PLLs receive the SYSTEM_CLK signal.

In one embodiment, the CLOCK_RST# signal is generated by memory address controller 230 and communicated to the memory data controllers having PLLs. In alternative embodiments, the CLOCK_RST# signal is generated by a different system component, for example, system data controller 235. When the PLLs receive the SYSTEM_CLK signal after then CLOCK_RST# signal is deasserted, the synchronization process is repeated individually by each PLL. However, because the synchronization process of the individual PLLs is synchronized, the PLLs synchronize to the same SYSTEM_CLK signal edge.

In the foregoing specification, the invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. A system comprising:
    a system clock generation circuit to generate a system clock signal;
    a plurality of clock generation circuits coupled to receive the system clock signal, the clock generation circuits to generate component clock signals based on the system clock signal; and
    circuitry coupled between the system clock generation circuit and the clock generation circuits, the circuitry to pass the system clock signal to the clock generation circuits for a first predetermined period of time and, at the expiration of the first predetermined period of time, to block the system clock signal from the clock generation circuits for a second predetermined period of time, the circuitry further to pass the system clock signal to the clock generation circuits at the expiration of the second predetermined period of time, wherein the clock generation circuits synchronize to the system clock during the first predetermined period of time and again after the expiration of the second predetermined period of time, further wherein the component clock signals have a common phase after the expiration of the second predetermined period of time.

2. The system of claim 1 wherein the plurality of clock generation circuits comprise a plurality of phase lock loop (PLL) devices.

3. The system of claim 1 wherein the plurality of clock generation circuits comprise a plurality of delay locked loop (DLL) devices.

4. The system of claim 1 wherein the plurality of clock generation circuits are part of a plurality of memory data controllers.

5. The system of claim 1 wherein the component clock signals are provided to portions of a memory array.

6. The system of claim 5 wherein the memory array provides clock feedback signals to the plurality of clock generation circuits.

7. A method comprising:
    synchronizing a plurality of clock generation circuits to a clock signal;
    after the clock signal has been received by the plurality of clock generation circuits for a first predetermined period of time, blocking the clock signal from the plurality of clock generation circuits for a second predetermined period of time; and
    re-synchronizing the plurality of clock generation circuits to the clock signal at the expiration of the second predetermined period of time.

8. The method of claim 7 wherein the plurality of clock generation circuits comprise a plurality of phase lock loop (PLL) devices.

9. The method of claim 7 wherein the plurality of clock generation circuits comprise a plurality of delay locked loop (DLL) devices.

10. The method of claim 7 wherein the plurality of clock generation circuits are part of a plurality memory data controllers.

11. The method of claim 7 wherein the component clock signals are provided to portions of a memory array.

12. The method of claim 11 wherein the memory array provides clock feedback signals to the plurality of clock generation circuits.

13. An apparatus for providing multiple synchronized clock signals to a component of an electronic system, the apparatus comprising:
    means for generating a clock signal;
    means for generating a plurality of component clock signals in response to the clock signal; and
    means for passing the clock signal to the means for generating the plurality of component clock signals for a first predetermined period of time, for blocking the clock signal for a second predetermined period of time, and for passing the clock signal at the expiration of the second predetermined period of time, wherein the means for generating the plurality of component clock signals synchronize to the clock signal during the first predetermined period of time and the plurality of component clock signals synchronize to the clock signal and have a common phase after the expiration of the second predetermined period of time.

14. The apparatus of claim 13 wherein the component clock signals are provided to portions of a memory array.

15. The apparatus of claim 14 wherein the memory array provides clock feedback signals to the plurality of clock generation circuits.

16. An apparatus comprising:
    a system clock generation circuit to generate a system clock signal;
    two or more component clock generation circuits coupled to receive the system clock signal, the component clock generation circuits to generate component clock signals based on the system clock signal; and
    two or more blocking devices coupled with the system clock generation circuit and with the one or more component clock generation circuits to pass the system clock signal during a first predetermined period of time and to block the system clock signal during a second predetermined period of time in response to a control signal.

17. The apparatus of claim 16 wherein the one or more blocking devices are one or more buffers.

18. The apparatus of claim 16 wherein the one or more blocking devices are one or more And gates.

19. The apparatus of claim 16 wherein the one or more blocking devices are one or more Nand gates.

20. The apparatus of claim 16 wherein the two or more component clock generation circuits comprise one or more phase locked loop (PLL) circuits.

21. The apparatus of claim 16 wherein the two or more component clock generation circuits comprise one or more delay locked loop (DLL) circuits.

22. The apparatus of claim 16 wherein one or more memory data controllers comprise the one or more component clock generation circuits.

23. The apparatus of claim 19 further comprising a memory array coupled with the one or more memory data controllers to receive the one or more component clock signals.

* * * * *